(12) United States Patent
Tang et al.

(10) Patent No.: US 12,040,156 B2
(45) Date of Patent: Jul. 16, 2024

(54) SAMPLE PROTECTION DEVICE FOR SCANNING ELECTRON MICROSCOPY

(71) Applicant: SHANGHAI NEMOR OPTOELECTRONIC TECHNOLOGY CO., LTD, Shanghai (CN)

(72) Inventors: Xuan Tang, Shanghai (CN); Jingwei Shen, Shanghai (CN)

(73) Assignee: SHANGHAI NEMOR OPTOELECTRONIC TECHNOLOGY CO., LTD., Shanghai (CN)

( * ) Notice: Subject to any disclaimer, the term of this patent is extended or adjusted under 35 U.S.C. 154(b) by 221 days.

(21) Appl. No.: 17/609,693

(22) PCT Filed: Sep. 24, 2020

(86) PCT No.: PCT/CN2020/117523
§ 371 (c)(1),
(2) Date: Nov. 8, 2021

(87) PCT Pub. No.: WO2021/077981
PCT Pub. Date: Apr. 29, 2021

(65) Prior Publication Data
US 2022/0216031 A1 Jul. 7, 2022

(30) Foreign Application Priority Data

Oct. 21, 2019 (CN) .......................... 201921763316.0
Nov. 5, 2019 (CN) .......................... 201921890783.X

(51) Int. Cl.
*H01J 37/20* (2006.01)
*H01J 37/18* (2006.01)

(52) U.S. Cl.
CPC ............ *H01J 37/20* (2013.01); *H01J 37/185* (2013.01); *H01J 2237/2006* (2013.01); *H01J 2237/204* (2013.01)

(58) Field of Classification Search
CPC .. H01J 37/20; H01J 37/185; H01J 2237/2006; H01J 2237/204
See application file for complete search history.

(56) References Cited

U.S. PATENT DOCUMENTS 9,296,542 B2 3/2016 Ho
2019/0287756 A1 9/2019 Stamsnijder et al.

FOREIGN PATENT DOCUMENTS

CN 1238552 A 12/1999
CN 107430973 A 12/2017
(Continued)

OTHER PUBLICATIONS

International Search Report dated Dec. 21, 2020 issued in corresponding parent Application No. PCT/CN2020/117523 (8 pages).
(Continued)

*Primary Examiner* — David E Smith
*Assistant Examiner* — Christopher J Gassen
(74) *Attorney, Agent, or Firm* — Polsinelli PC

(57) ABSTRACT

A sample protection device for a scanning electron microscope, the sample protection device comprising: a shell; an accommodating part having an accommodating space for accommodating a sample, the accommodating part being arranged in the shell in such a manner that the accommodating part can move relative to the shell, such that the accommodating part at least partially enters the shell or moves out of the shell; a sealing part connected to the accommodating part and configured to seal between the accommodating part and the shell when the accommodating part is at least partially accommodated in the shell; and a (Continued)

driving member configured to drive relative movement of the shell relative to the accommodating part.

11 Claims, 3 Drawing Sheets

(56) References Cited

FOREIGN PATENT DOCUMENTS

| | | |
|---|---|---|
| CN | 107902265 A | 4/2018 |
| CN | 209388997 U | 9/2019 |
| CN | 210668268 U | 6/2020 |
| CN | 210743910 U | 6/2020 |
| JP | 11-213931 A | 8/1999 |
| WO | 2014/175074 A1 | 10/2014 |

OTHER PUBLICATIONS

Written Opinion dated Dec. 21, 2020 issued in corresponding parent Application No. PCT/CN2020/0117523 (5 pages).
Japanese Office Action dated May 20, 2022 issued in corresponding Patent Application No. 2021-537218 w/English Translation (7 pages).

SAMPLE PROTECTION DEVICE FOR SCANNING ELECTRON MICROSCOPY

CROSS REFERENCE TO RELATED APPLICATIONS

This application is a National Phase of International Application No. PCT/CN2020/117523 filed Sep. 24, 2020 which claims priority to Chinese Patent Applications No. 201921890783.X, filed on Nov. 5, 2019, entitled "sample transferring box for scanning electron microscope", and No. 201921763316.0, filed on Oct. 21, 2019, entitled "solid-state battery in-situ observing compartment for scanning electron microscope", the contents of which are incorporated herein in their entireties by reference.

TECHNICAL FIELD

The present disclosure relates to a field of sample protection technology, and in particular, to a sample protection device for a scanning electron microscope.

BACKGROUND

Scanning electron microscopes are instruments used to observe surface morphologies of objects or materials. When using the scanning electron microscope to observe samples, the requirements for samples are higher. The surface morphology of the observed material exhibits a microstructure. Since some samples are exposed to air, they are easily contaminated by the air when they are transferred to the chamber of the scanning electron microscope, which leads to changes in the micro-morphology of the surface of the material, thereby affecting results of the observation.

SUMMARY

An object of the present application provides a sample protection device for a scanning electron microscope, to address problems mentioned in the background.

According to a first aspect of the present application, a sample protection device for a scanning electron microscope is provided. The sample protection device includes: a shell; an accommodating part including an accommodating space for accommodating a sample, and the accommodating part being disposed in the shell in such a way that the accommodating part and the shell are movable relative to each other, so that the accommodating part is at least partially moved into the shell, or is moved out of the shell; a sealing part connected to the accommodating part, and when the accommodating part is at least partially received in the shell, a seal between the accommodating part and the shell is achieved; and a driving member configured to drive a relative movement of the shell and the accommodating part.

The shell is used to at least partially receive the accommodating part accommodating the sample, and the sealing part is used to achieve the seal between the accommodating part and the shell, thereby preventing the influence of the air on the observation results of the sample, which is beneficial to improve the accuracy of observation.

In one embodiment, the sealing part is a gastight rubber ring.

In one embodiment, the accommodating part is in communication with an internal space of the shell. The accommodating part is disposed with a one-way gas valve. The one-way gas valve is configured to evacuate gas in the shell during the accommodating part entering the shell.

In one embodiment, the driving member is a non-magnetic elastic member. The driving member is configured to be in a deformed state due to compression of the accommodating part, after the accommodating part enters the shell; is configured to restore its deformation when gas pressure outside the shell is less than gas pressure inside the shell; and pushes the accommodating part out of the shell during restoring its deformation.

In one embodiment, the sample protection device further includes a sliding rail. The shell is slidably connected to the sliding rail. The driving member is a motor. The motor drives the shell to slide along the sliding rail.

In one embodiment, the sample protection device further includes a clamping and fixing component configured to fix the sample to the accommodating part.

In one embodiment, the clamping and fixing component includes a moving end position and a fixed end position that are coaxially arranged. The sample is accommodated in an area between the fixed end position and the moving end position.

According to a second aspect of the present application, a sample transferring box for a scanning electron microscope is provided, which includes a housing with a cavity and an observing compartment slidably disposed in the housing. The housing is disposed with a gap configured to observe objects in the observing compartment. A cavity in the observing compartment is in communication with the cavity in the housing. The observing compartment is disposed with a one-way gas valve. The observing compartment is disposed with a gastight rubber ring configured to seal the housing and the observing compartment. A non-magnetic elastic member is disposed between the observing compartment and the housing. The non-magnetic elastic member is configured to push the observing compartment out of the housing without the observing compartment being separated from the housing.

In one embodiment, the housing includes a main housing and a main housing rear cover. The main housing rear cover is connected to the main housing by a bolt. One end of the non-magnetic elastic member is detachably connected to the main housing rear cover, and the other end of the non-magnetic elastic member is engaged in a groove of the observing compartment.

In one embodiment, the non-magnetic elastic member is a non-magnetic spring.

In one embodiment, the non-magnetic spring is a SUS304L spring, a SUS304H spring or a SUS316L spring.

In one embodiment, the gastight rubber ring is connected to the observing compartment in such a way that the gastight rubber ring is engaged in an engaging groove of the observing compartment.

In one embodiment, the housing is made of one or more selected from copper, stainless steel, aluminum alloy, resin, or high polymer material.

In one embodiment, the observing compartment is made of one or more selected from copper, stainless steel, aluminum alloy, resin, or high polymer material.

In one embodiment, the gastight rubber ring is made of one or more selected from silica gel, reinforced polypropylene, and polytetrafluoroethylene.

In one embodiment, two non-magnetic elastic members are provided. The non-magnetic elastic members are symmetrically disposed on an inner wall of the observing compartment.

According to a third aspect of the present application, a solid-state battery in-situ observing compartment for a scanning electron microscope is provided. The solid-state battery in-situ observing compartment includes a housing disposed with a gastight compartment, a gastight compartment driving motor configured to drive the gastight compartment to be displaced, a clamping and fixing component, a driving member configured to drive the clamping and fixing component to operate, and a test solid-state battery. The clamping and fixing component is configured to clamp and fix the test solid-state battery. A gastight rubber ring is sleeved on an outer surface of the clamping and fixing component. The housing is further disposed with a gastight compartment sliding rail. The gastight compartment is slidable along the gastight compartment sliding rail. The gastight compartment is provided opposite to the clamping and fixing component, and is configured to enclose the test solid-state battery.

In one embodiment, the clamping and fixing component includes a fixed end position and a moving end position. The fixed end position and the moving end position are coaxially provided. The test solid-state battery is placed in an area between the fixed end position and the moving end position.

In one embodiment, the driving member include a moving end position driving motor.

In one embodiment, the moving end position driving motor is a stator coil motor.

In one embodiment, the gastight compartment driving motor is a stator coil motor.

In one embodiment, the housing and the gastight compartment are made of non-magnetic conductive materials.

In one embodiment, the housing and the gastight compartment are made of copper.

According to a fourth aspect of the present application, a method of using a sample transferring box for a scanning electron microscope is provided. The sample transferring box for the scanning electron microscope includes a housing with a cavity and an observing compartment slidably disposed in the housing. The housing is disposed with a gap configured to observe objects in the observing compartment. The housing and the observing compartment are a non-magnetic housing and a non-magnetic observing compartment, respectively. A cavity in the observing compartment is in communication with the cavity in the housing. The observing compartment is disposed with a one-way gas valve. The observing compartment is disposed with a gastight rubber ring configured to seal the housing and the observing compartment. A non-magnetic elastic member is disposed between the observing compartment and the housing. The non-magnetic elastic member is configured to push the observing compartment out of the housing without the observing compartment being separated from the housing.

The method of using the sample transferring box for the scanning electron microscope includes:
putting a sample in the observing compartment in a glove box protected by inert gas, and pushing the observing compartment to a bottom of the housing;
placing the sample transferring box for the scanning electron microscope in a chamber of the scanning electron microscope, evacuating gas in the chamber, so that the observing compartment is pushed out of the housing through the non-magnetic elastic member; observing the sample in the observing compartment through the gap;
injecting gas into the chamber of the scanning electron microscope to increase gas pressure around the sample protection device, so as to press the observing compartment back into the housing due to increased external gas pressure.

According to a fifth aspect of the present application, a method of using a solid-state battery in-situ observing compartment for a scanning electron microscope is provided. The solid-state battery in-situ observing compartment for the scanning electron microscope includes a housing disposed with a gastight compartment, a gastight compartment driving motor configured to drive the gastight compartment to be displaced, a clamping and fixing component, a driving member configured to drive the clamping and fixing component to operate, and a test solid-state battery. The clamping and fixing component is configured to clamp and fix the test solid-state battery. A gastight rubber ring is sleeved on an outer surface of the clamping and fixing component. The housing is further disposed with a gastight compartment sliding rail. The gastight compartment is slidable along the gastight compartment sliding rail. The gastight compartment is provided opposite to the clamping and fixing component, and is configured to enclose the test solid-state battery.

The method of using the solid-state battery in-situ observing compartment for the scanning electron microscope includes:
assembling the observing compartment and the test solid-state battery in a glove box protected by argon gas, and clamping and fixing the test solid-state battery by the moving end position driven by the moving end position driving motor;
the gastight compartment moving along the gastight compartment sliding rail toward the gastight rubber ring to enclose the test solid-state battery driven by the gastight compartment driving motor;
placing the solid-state battery in-situ observing compartment in a chamber of the scanning electron microscope; evacuating gas in the chamber; opening the gastight compartment driven again by the gastight compartment driving motor; completing a transfer of the test solid-state battery from the glove box into the chamber of the scanning electron microscope.

Details of one or more embodiments of the present application are set forth in the following drawings and description. Other features and advantages of the present application will become apparent from the description, drawings, and claims.

BRIEF DESCRIPTION OF THE DRAWINGS

To illustrate the technical solutions according to the embodiments of the present application more clearly, the accompanying drawings for describing the embodiments are introduced briefly in the following. Apparently, the accompanying drawings in the following description are only some embodiments of the present application, and persons of ordinary skill in the art can derive other drawings from the accompanying drawings without creative efforts.

REFERENCE NUMERALS

10—shell, 20—accommodating part, 30—sealing part, 40—driving member, 1—observing compartment, 2—engaging groove, 3, 202—gastight rubber ring, 4—one-way gas valve, 5—gap, 6—housing, 7—non-magnetic elastic member, 8—main housing rear cover, 100—housing, 201—gastight compartment, 300—fixed end position, 400—moving end position, 501—gastight compartment driving motor, 502—moving end position driving motor, 600—gastight compartment sliding rail, 700—test solid-state battery.

DETAILED DESCRIPTION OF THE EMBODIMENTS

Technical solutions in embodiments of the present application will be clearly and completely described below in conjunction with the drawings in the embodiments of the present application. Apparently, the described embodiments are only a part of the embodiments of the present application, rather than all the embodiments. Based on the embodiments in the present application, all other embodiments obtained by those of ordinary skill in the art without creative work shall fall within the protection scope of the present application.

Figure 1:
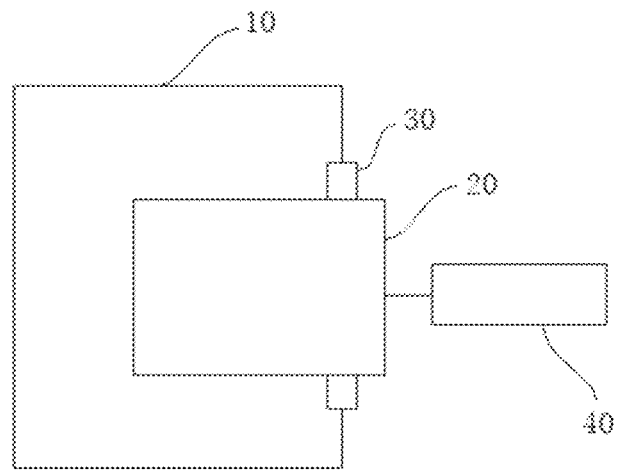
FIG. 1 is a structural schematic view of a sample protection device according to the present application.

Referring to FIG. 1, according to one embodiment of the present application, a sample protection device for a scanning electron microscope is provided, which includes a shell 10 and an accommodating part 20. The accommodating part 20 has an accommodating space. During using the scanning electron microscope, a sample to be observed can be put into the accommodating space. The shell 10 can be moved relative to the accommodating part 20, so that the accommodating part 20 is disposed in the shell 10 in a movable manner with respect to the shell 10. In this way, the accommodating part 20 is at least partially received in the shell 10, or is moved out of the shell 10. The accommodating part 20 is connected to a sealing part 30. The sealing part 30 can achieve a seal between the accommodating part 20 and the shell 10 when the accommodating part 20 is at least partially received in an observing compartment, so as to ensure the sample in the accommodating part 20 is not in contact with external air. The sample protection device further includes a driving member 40 configured to drive a relative movement of the shell 10 and the accommodating part 20. It should be understood that although the driving member 40 is shown as being connected to the accommodating part 20 in FIG. 1, it is only an embodiment. In other embodiments, the driving member 40 may also be connected to the shell 10, as long as the driving member 40 can realize the relative movement of the shell 10 and the accommodating part 20.

Further, the sealing part 30 may be a gastight rubber ring, which is detachably disposed on the accommodating part 20. As those skilled in the art can understand, the sealing part 30 can be other components according to actual needs, such as components made of polytetrafluoroethylene, soft bakelites, graphite rings, etc., as long as the sealing part 30 can realize the seal between the accommodating part 20 and the shell 10. Preferably, the sealing part 30 is made of an elastic material and has abrasion resistance. The accommodating part 20 may be disposed with a one-way gas valve. The accommodating part 20 is in communication with an internal space of the shell 10. The driving member 40 may be a non-magnetic elastic member, such as a spring, etc.

During the accommodating part 20 entering the shell 10, since the accommodating part 20 is in communication with the shell 10, the gas in the shell 10 is compressed, and is discharged outside of the shell 10 via the one-way gas valve disposed on the accommodating part 20. In this case, the spring is compressed by the accommodating part 20 and then deformed. When the gas in the shell 10 is emptied, the shell 10 is in a high vacuum state. In this case, the outside gas pressure is higher than the gas pressure in the shell 10, and the spring remains in a deformed state due to the existence of the gas pressure difference. When the gas pressure outside the shell 10 is less than the gas pressure inside the shell 10, the spring restores its deformation and pushes the accommodating part 20 out of the shell 10 during the process of restoring its deformation.

Figure 2:
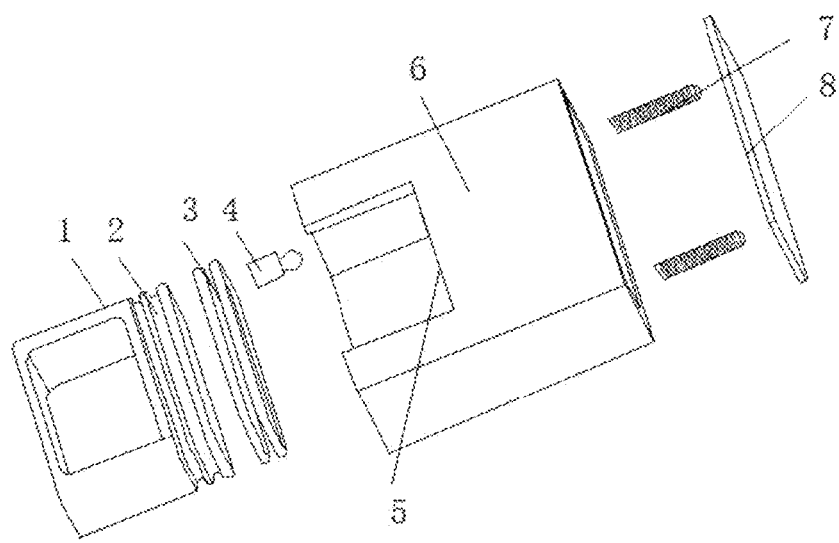
FIG. 2 is a structural schematic view of a sample protection device according to one embodiment of the present application.
Figure 3:
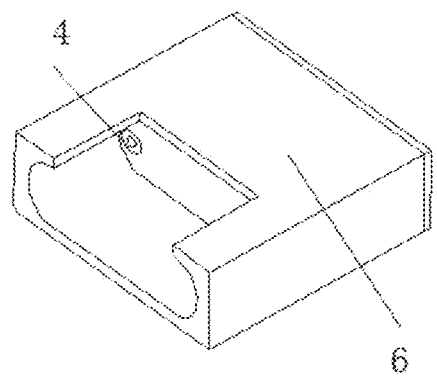
FIG. 3 is a structural schematic view of an observing compartment when enclosed in a housing according to one embodiment of the present application.
Figure 4:
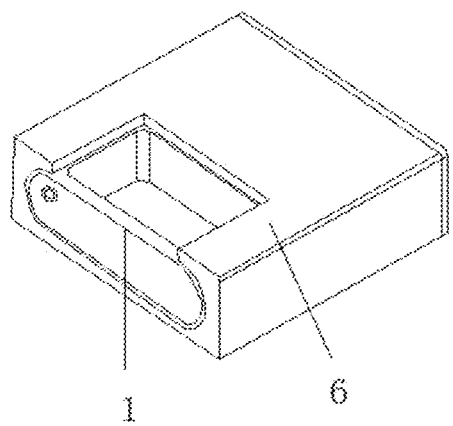
FIG. 4 is a structural schematic view of an observing compartment when moved out of a housing according to one embodiment of the present application.

Specifically, referring to FIGS. 2-4, in one embodiment, the above-mentioned sample protection device for the scanning electron microscope may be a sample transferring box of the scanning electron microscope. The shell 10 can be a housing 6 with a cavity. The accommodating part 20 can be an observing compartment 1. The sealing part 30 can be a gastight rubber ring 3. The driving member 40 can be a non-magnetic elastic member 7. Specifically, the observing compartment 1 is slidably disposed in the housing 6. The housing 6 is disposed with a gap 5, which facilitates the observation of objects in the observing compartment 1. A cavity in the observing compartment 1 is in communication with the cavity in the housing 6. The observing compartment 1 is disposed with a one-way gas valve 4. The observing compartment 1 is disposed with the gastight rubber ring 3 for sealing the housing 6 and the observing compartment 1. The non-magnetic elastic member 7 is disposed between the observing compartment 1 and the housing 6. The non-magnetic elastic member 7 is used to push the observing compartment out of the housing 6 and keep the observing compartment 1 from being separated from the housing 6. It should be understood that FIG. 2 is an exploded view of this embodiment, which is only intended to show the independent form of each component, and does not mean that the positional relationship and connection relationship between these components are necessarily to be provided as shown. In other words, the positional relationship and connection relationship between components should be understood in conjunction with other drawings.

Preferably, the housing 6 includes a main housing and a main housing rear cover 8. The main housing rear cover 8 and the main housing are connected by connecting bolts. One end of the non-magnetic elastic member 7 is detachably connected to the main housing rear cover 8, and the other end of the non-magnetic elastic member 7 is engaged in a groove on the observing compartment 1, which is convenient for disassembly and replacement of the non-magnetic elastic member 7.

Preferably, the non-magnetic elastic member 7 is a non-magnetic spring, which has a long service life.

Preferably, the non-magnetic spring is a SUS316L spring, which has good resistance to intergranular corrosion.

In other embodiments, the non-magnetic spring 7 is a SUS304H spring or a SUS304L spring.

Preferably, the gastight rubber ring 3 is connected to the observing compartment 1 in such a way that the gastight rubber ring 3 is engaged in an engaging groove 2 on the observing compartment 1 to facilitate the disassembly and replacement of the gastight rubber ring 3.

Preferably, the housing 6 is made of copper, which has good wear resistance.

In other embodiments, the housing 6 is made of one or more selected from stainless steel, aluminum alloy, resin, or high polymer material.

Preferably, the observing compartment 1 is made of copper, which has good wear resistance.

In other embodiments, the observing compartment 1 is made of one or more selected from stainless steel, aluminum alloy, resin, or high polymer material.

Preferably, the gastight rubber ring 3 is made of polytetrafluoroethylene and has a low friction coefficient.

In other embodiments, the gastight rubber ring 3 is made of silica gel or reinforced polypropylene.

Preferably, two non-magnetic elastic members 7 are provided. The non-magnetic elastic members 7 are symmetrically disposed on an inner wall of the observing compartment 1, which has a good push-out effect on the observing compartment 1.

The method of using the sample protection device according to this embodiment is as follows.

Firstly, the sample is put in the observing compartment 1 in a glove box protected by inert gas. Then, the observing compartment 1 is pushed to the bottom of the main housing. The gas in the main housing is discharged to the outside of the main housing through the one-way gas valve 4. The observing compartment 1 is fixed to the bottom of the main housing (as shown in FIG. 3) under the external atmospheric pressure. The gastight rubber ring 3 prevents external gas from penetrating into the main housing, ensuring the gastight effect.

Then, the assembled and enclosed sample device is placed in a chamber of the scanning electron microscope, and the air in the chamber is evacuated, so that the observing compartment 1 is pushed out of the main housing through the non-magnetic elastic member 7 (as shown in FIG. 4). In this case, the sample in the observing compartment 1 can be observed.

After the observation is completed, if it is necessary for the observing compartment 1 to return to the main housing, gas can be injected into the chamber of the scanning electron microscope to increase the gas pressure around the sample protection device. In this case, the observing compartment 1 will be pressed back into the main housing due to the increased external gas pressure.

According to the above embodiment, the sample device and the elastic member made of non-magnetic materials can be used to prevent the influence of the magnetic material on the imaging of the observation results of the sample, which is beneficial to improve the accuracy of the observation. In addition, when the observing compartment is enclosed, the gas in the main housing is discharged through the one-way gas valve. In addition, the one-way gas valve can prevent the entering of the external gas, so that the observing compartment is not opened under the external gas pressure. When the sample device enters the chamber of the scanning electron microscope, the gas pressure decreases, and thus the non-magnetic elastic member pushes the observing compartment out of the main housing. In this case, the sample can be observed, and the use of motors or electromagnets can be avoided. In addition, no external controlling cables are required.

According to another embodiment of the present application, the sample protection device includes a sliding rail. The shell 10 is slidably connected to the sliding rail. The driving member 40 is a motor. The shell 10 can slide along the sliding rail driven by the motor. The sample protection device further includes a clamping and fixing component for fixing the sample to the accommodating part 20. As an example, the clamping and fixing component may include a moving end position and a fixed end position that are coaxially arranged. The sample is accommodated in an area between the fixed end position and the moving end position.

Figure 5:
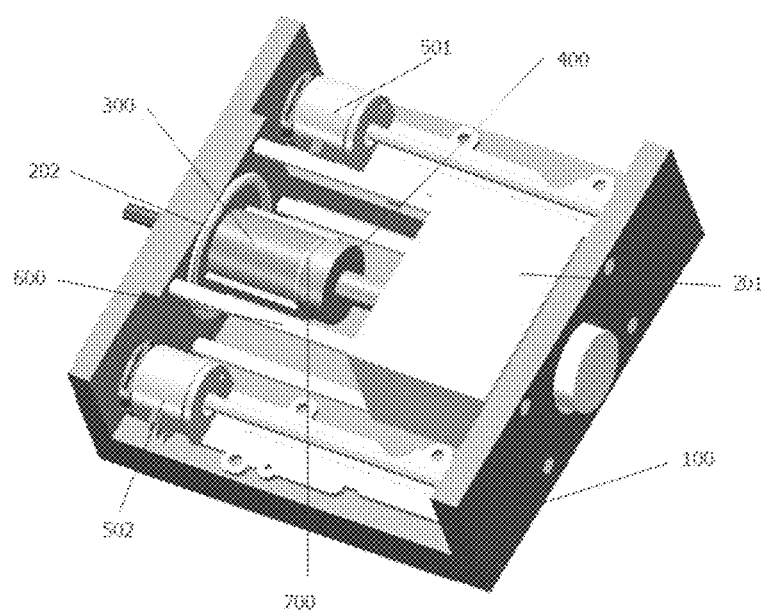
FIG. 5 is an overall structural schematic view of a sample protection device according to another embodiment of the present application.

Specifically, referring to FIG. 5, in one embodiment, the sample protection device for the scanning electron microscope may be a solid-state battery in-situ observing compartment for a scanning electron microscope. The shell 10 can be a gastight compartment 201. The sealing part 30 can be a gastight rubber ring 202. The driving member 40 can be a gastight compartment driving motor 501 for driving the gastight compartment 201 to be displaced. The gastight compartment 201 and the accommodating part 20 are both disposed in a housing 100. The solid-state battery in-situ observing compartment further includes a clamping and fixing component. The sample is a solid-state battery 700. The clamping and fixing component is used to clamp and fix the test solid-state battery 700. The gastight rubber ring 202 is disposed on an outer surface of the clamping and fixing component. A gastight compartment sliding rail 600 is further disposed in the housing 100. The gastight compartment 201 can slide on the gastight compartment sliding rail 600. The gastight compartment 201 is provided opposite to the clamping and fixing component, and is used to enclose the test solid-state battery 700.

Preferably, the clamping and fixing component includes a fixed end position 300 and a moving end position 400. The fixed end position 300 and the moving end position 400 are coaxially provided. The test solid-state battery 700 is placed in an area between the fixed end position 300 and the moving end position 400.

Preferably, the driving member includes a moving end position driving motor 502. More specifically, the moving end position driving motor 502 and the gastight compartment driving motor 501 are both stator coil motors.

Preferably, both the housing 100 and the gastight compartment 201 are made of non-magnetic conductive materials. Preferably, the housing 100 and the gastight compartment 201 are made of copper.

A method of using the sample protection device according to this embodiment is as follows.

Firstly, the observing compartment and the test solid-state battery 700 are assembled in a glove box protected by argon gas. The test solid-state battery 700 is clamped and fixed by the moving end position 400 driven by the moving end position driving motor 502. Then, the gastight compartment 201 is driven by the gastight compartment driving motor 501 to move along the gastight compartment sliding rail 600 toward the gastight rubber ring 202 to enclose the test solid-state battery 700.

The assembled and enclosed observing compartment is placed in the chamber of the scanning electron microscope. The gas in the chamber is evacuated. The gastight compartment 201 is opened driven again by the gastight compartment driving motor 501. Thus, a transfer of the test solid-state battery 700 from the glove box into the chamber of the scanning electron microscope is completed.

According to the above embodiment, the test solid-state battery is mounted between the fixed end position of the solid-state battery and the moving end position of the solid-state battery, through the gastight compartment in the glove box filled with argon. After the gastight compartment is closed, the observing compartment is moved to the chamber of the scanning electron microscope, it is ensured that the test solid-state battery is not polluted by the air before the observation. In addition, the stator coil motor can be used to prevent the magnetism of a permanent magnet motor from affecting the imaging of the scanning electron microscope, thereby facilitating the accuracy of observation.

Furthermore, through the control of the stator coil motor, it is convenient to open a cover of the observing compartment in the chamber of the scanning electron microscope. In addition, the use of non-magnetic conductive materials prevents the magnetism of the permanent magnet motor from affecting the imaging of the scanning electron microscope, thereby facilitating the accuracy of observation.

While the embodiments of the present application have been shown and described, for those of ordinary skill in the art, it can be understood that various changes, modifications, replacements, and variations can be made to these embodiments without departing from the principle and spirit of the present application, the scope of the present application shall be subject to the appended claims and their equivalents.

What is claimed is:

1. A sample protection device for a scanning electron microscope, comprising:
   a shell;
   an accommodating part comprising an accommodating space for accommodating a sample, and the accommodating part being disposed in the shell in such a way that the accommodating part and the shell are movable relative to each other, so that the accommodating part is at least partially moved into the shell, or is moved out of the shell;
   a sealing part connected to the accommodating part, and when the accommodating part is at least partially received in the shell, a seal between the accommodating part and the shell is achieved; and
   a driving member configured to drive a relative movement of the shell and the accommodating part,
   wherein the accommodating part is in communication with an internal space of the shell; and the accommodating part is disposed with a one-way gas valve; the one-way gas valve is configured to evacuate gas in the shell during the accommodating part entering the shell.

2. The sample protection device for the scanning electron microscope according to claim 1, wherein the sealing part is a gastight rubber ring.

3. The sample protection device for the scanning electron microscope according to claim 1, wherein the driving member is a non-magnetic elastic member; and the driving member is configured to be in a deformed state due to compression of the accommodating part, after the accommodating part enters the shell; and the driving member is configured to restore its deformation when gas pressure outside the shell is less than gas pressure inside the shell, and push the accommodating part out of the shell during restoring its deformation.

4. The sample protection device for the scanning electron microscope according to claim 1, further comprising a sliding rail; the shell is slidably connected to the sliding rail; the driving member is a motor; the motor drives the shell to slide along the sliding rail.

5. A sample transferring box for a scanning electron microscope, comprising a housing with a cavity and an observing compartment slidably disposed in the housing; the housing being disposed with a gap configured to observe objects in the observing compartment, wherein the housing and the observing compartment are a non-magnetic housing and a non-magnetic observing compartment, respectively; a cavity in the observing compartment is in communication with the cavity in the housing; the observing compartment is disposed with a one-way gas valve; the observing compartment is disposed with a gastight rubber ring configured to seal the housing and the observing compartment; a non-magnetic elastic member is disposed between the observing compartment and the housing; the non-magnetic elastic member is configured to push the observing compartment out of the housing without the observing compartment being separated from the housing; the non-magnetic elastic member is configured to push the observing compartment out of the housing without the observing compartment being separated from the housing.

6. The sample transferring box for the scanning electron microscope according to claim 5, wherein the housing comprises a main housing and a main housing rear cover; the main housing rear cover is connected to the main housing by a bolt; a first end of the non-magnetic elastic member is detachably connected to the main housing rear cover, and a second end of the non-magnetic elastic member is engaged in a groove of the observing compartment.

7. The sample transferring box for the scanning electron microscope according to claim 6, wherein the gastight rubber ring is connected to the observing compartment in such a way that the gastight rubber ring is engaged in an engaging groove of the observing compartment.

8. The sample transferring box for the scanning electron microscope according to claim 7, wherein the observing compartment is made of one or more selected from copper, stainless steel, aluminum alloy, resin, or high polymer material.

9. The sample transferring box for the scanning electron microscope according to claim 8, wherein two non-magnetic elastic members are provided; the non-magnetic elastic members are symmetrically disposed on an inner wall of the observing compartment.

10. The sample transferring box for the scanning electron microscope according to claim 5, wherein the non-magnetic elastic member is a non-magnetic spring.

11. The sample transferring box for the scanning electron microscope according to claim 10, wherein the housing is made of one or more selected from copper, stainless steel, aluminum alloy, resin, or high polymer material.

* * * * *